US009823678B1

(12) United States Patent
Lin (10) Patent No.: US 9,823,678 B1
(45) Date of Patent: Nov. 21, 2017

(54) METHOD AND APPARATUS FOR LOW DROP OUT VOLTAGE REGULATION

(71) Applicant: Avago Technologies General IP (Singapore) Pte. Ltd., Singapore (SG)

(72) Inventor: Saihua Lin, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/191,510

(22) Filed: Jun. 23, 2016

(51) Int. Cl.
*G05F 1/575* (2006.01)
*H03F 3/45* (2006.01)

(52) U.S. Cl.
CPC ......... *G05F 1/575* (2013.01); *H03F 3/45475* (2013.01)

(58) Field of Classification Search
CPC . G05F 1/56; G05F 1/575; G05F 1/569; G05F 3/16; G05F 3/26; G05F 3/262; H02M 3/156; H02M 3/157; H02M 3/155
USPC ....... 323/273, 276, 280, 282, 283, 311, 315, 323/316, 351
See application file for complete search history.

(56) References Cited

U.S. PATENT DOCUMENTS

| | | | | |
|---|---|---|---|---|
| 5,017,857 A * | 5/1991 | Fox | ..................... | H02M 5/458 322/25 |
| 5,804,958 A * | 9/1998 | Tsui | ..................... | G05F 3/262 323/313 |
| 7,449,869 B2 * | 11/2008 | Markowski | ..................... | H02M 3/157 323/265 |
| 7,902,803 B2 * | 3/2011 | Peng | ..................... | H02M 3/157 323/283 |
| 8,461,819 B2 * | 6/2013 | Kato | ..................... | G01R 19/0092 323/271 |
| 8,493,049 B2 * | 7/2013 | Kwan | ..................... | H02M 3/156 323/271 |
| 8,878,505 B2 * | 11/2014 | Temkin | ..................... | H02M 3/33523 323/282 |
| 8,937,469 B2 * | 1/2015 | Clark | ..................... | G05F 1/70 323/207 |
| 2007/0159146 A1 * | 7/2007 | Mandal | ..................... | G05F 1/575 323/280 |

* cited by examiner

Primary Examiner — Adolf Berhane (57) ABSTRACT

A voltage regulator includes: a difference amplifier with first input terminal connected to a reference voltage; a first transistor having a first terminal connected to a supply voltage, a control terminal connected to the output terminal of the difference amplifier, and a second terminal configured to supply a regulated voltage to a load; a feedback circuit connected to the second terminal of the first transistor and configured to supply a feedback voltage to a second input terminal of the difference amplifier; and a current compensator configured to draw a compensation current from the first transistor when a load current supplied by the first transistor to the load is less than a threshold current, thereby increasing the first current through the first transistor, and configured to draw substantially no compensation current from the first transistor when the load current is greater than or equal to the threshold current.

20 Claims, 4 Drawing Sheets

METHOD AND APPARATUS FOR LOW DROP OUT VOLTAGE REGULATION

BACKGROUND

A voltage regulator is often employed to supply a stable, regulated, voltage having a predetermined voltage level to one or more circuits in an electronic device.

When a voltage regulator is included in a battery-powered device, such a mobile phone (e.g., a smartphone), a few performance parameters become particularly important.

One of these parameters is the drop out voltage of the voltage regulator, which is the difference between the minimum supply voltage which supplies the regulator and the regulated voltage output by the voltage regulator. In many cases it is desired for a voltage regulator to have as low of a drop out voltage as possible, especially in the case of battery-operated devices (e.g., mobile phones) where the battery voltage level is generally relatively low to begin with, and which may drop significantly as it is drained to a specified minimum battery voltage level at which the battery-operated device is expected to still operate properly.

Another important parameter for a voltage regulator is power consumption, that is, the power which is consumed by the voltage regulator itself separate from the power consumed by any load which is supplied by the voltage regulator. Power consumption may be related to the efficiency of the voltage regulator which maybe expressed in terms of the current or power which the voltage regulator supplies to a load compared to the power consumed by, or the quiescent current of, the voltage regulator itself. In many cases it is desired for the voltage regulator to be as efficient as possible, or to have as low of a power consumption as possible given the required load current, especially in the case of battery-operated devices (e.g., mobile phones) where the battery, where there may be a total power budget for the device in which case energy which is consumed by the voltage regulator drains the battery and reduces the time between battery recharges or replacement (for devices with non-rechargeable batteries). Low power consumption by a voltage regulator may be particularly important in the case of a battery-operated device, since the voltage regulator may, in general, always be operating or "on" as long as the device itself is operating.

Yet another important parameter for many voltage regulators is phase margin or stability. More specifically, some voltage regulator circuits employ feedback to maintain the regulated voltage level within a specified range or tolerance. In that case, if the phase margin of the feedback loop is too low, then the voltage regulator may begin to oscillate. This may occur, for example, if the quiescent current of the voltage regulator is too small, particularly at low load currents. The quiescent current of the voltage regulator may be increased to increase the phase margin, but that will increase the power consumed by the voltage regulator and decrease its efficiency, which as explained above is undesirable.

What is needed, therefore, is a voltage regulator which can simultaneously provide a low dropout voltage and adequate phase margin, while not consuming an unnecessarily large amount of power.

SUMMARY

In one aspect of the inventive concept, a voltage regulator comprises: a difference amplifier having a first input terminal, a second input terminal, and an output terminal, wherein the first input terminal is connected to receive a reference voltage; a first transistor having a first size and further having a first terminal, a second terminal, and a control terminal, wherein the first terminal is connected to a supply voltage, the second terminal is configured to supply a regulated voltage to a load, and the control terminal is connected to the output terminal of the difference amplifier, wherein the first transistor is configured to conduct a first current therethrough; a feedback circuit connected to the second terminal of the first transistor and configured to supply a feedback voltage to the second input terminal of the difference amplifier; a second transistor having a second size which is less than the first size, and further having a first terminal, a second terminal, and a control terminal, wherein the first terminal is connected to the supply voltage, and the control terminal is connected to the output terminal of the difference amplifier, wherein the second transistor is configured to conduct a second current therethrough which is less than the first current; and a current compensator having a first terminal, a second terminal, and an output terminal, wherein the first terminal is configured to receive a reference current, the second terminal is connected to the second terminal of the second transistor to receive the second current, and the output terminal connected to the second terminal of the first transistor, wherein when the second current is greater than or equal to the reference current, then the output terminal of the current compensator draws substantially no current from the second terminal of the first transistor, and when the second current is less than the reference current, then the output terminal of the current compensator draws a non-zero compensation current from the second terminal of the first transistor which is proportional to a difference between the reference current and the second current.

In some embodiments, the current compensator comprises a plurality of current mirrors, including: a first current mirror, a second current mirror for mirroring the reference current to a first branch of the first current mirror, a third current mirror for mirroring the second current to a second branch of the first current mirror, and a fourth current mirror for mirroring to the output terminal a difference current between a current in the second branch of the first current mirror and the second current.

In some embodiments, the second current is equal to the first current divided by N, wherein N is a number greater than or equal to two.

In some versions of these embodiments, N is a number greater than or equal to 10.

In some embodiments, the feedback circuit comprises a resistor divider comprising at least two resistors connected in series between the second terminal of the first transistor and a second supply voltage, and wherein the second input terminal of the difference amplifier is connected to a node between the at least two resistors.

In some embodiments, the regulated voltage is greater than the reference voltage.

In some embodiments, the first input terminal of the difference amplifier is a non-inverting input, the second input terminal of the difference amplifier is an inverting input, and the first and second transistors are each P-channel field effect transistors.

In another aspect of the inventive concept, a method comprises: supplying a reference voltage to a first input terminal of a difference amplifier; conducting a first current through a first transistor having a first size, wherein a first terminal of the first transistor is connected to a supply voltage, and a control terminal of the first transistor is connected to an output terminal of the difference amplifier, supplying a feedback voltage to the second input terminal of the difference amplifier via a feedback circuit connected to a second terminal of the first transistor; conducting a second current, which is less than the first current, through a second transistor having a second size which is less than the first size, wherein a first terminal of the second transistor is connected to the supply voltage, and a control terminal of the second transistor is connected to the output terminal of the difference amplifier; supplying a reference current to a first terminal of a current compensator; receiving the second current at a second terminal of the current compensator; when the second current is greater than or equal to the reference current, the current compensator drawing substantially zero current through an output terminal of the current compensator which is connected to the second terminal of the first transistor; when the second current is less than the reference current, the current compensator drawing a non-zero compensation current through the output terminal of the current compensator from the second terminal of the first transistor, wherein the non-zero compensation current is proportional to a difference between the reference current and the second current; and supplying a regulated voltage from a second terminal of the first transistor to a load.

In some embodiments, the method further comprises: mirroring the reference current to a first branch of a first current mirror; mirroring the second current to a second branch of the first current mirror; mirroring to the output terminal of the current compensator a difference current between a current in the second branch of the first current mirror and the second current.

In some embodiments, the second current is equal to the first current divided by N, wherein N is a number greater than or equal to two.

In some versions of these embodiments, N is a number greater than or equal to 10.

In some embodiments, the regulated voltage is greater than the reference voltage.

In yet another aspect of the inventive concept, a voltage regulator comprises: a difference amplifier having a first input terminal, a second input terminal, and an output terminal, wherein the first input terminal is connected to receive a reference voltage; a first transistor having a first terminal, a second terminal, and a control terminal, wherein the first terminal is connected to a supply voltage, the second terminal is configured to supply a regulated voltage to a load, and the control terminal is connected to the output terminal of the difference amplifier, wherein the first transistor is configured to conduct a first current therethrough; a feedback circuit connected to the second terminal of the first transistor and configured to supply a feedback voltage to the second input terminal of the difference amplifier; and a current compensator configured to draw a compensation current from the first transistor when a load current supplied by the first transistor to the load is less than a threshold current, thereby increasing the first current, and configured to draw substantially no compensation current from the first transistor when the load current supplied by the first transistor to the load is greater than or equal to the threshold current.

In some embodiments, the current compensator has a first terminal configured to receive a reference current.

In some embodiments, the voltage regulator further comprises a second transistor which is smaller than the first transistor, wherein the second transistor has a first terminal, a second terminal, and a control terminal, wherein the first terminal is connected to the supply voltage, and the control terminal is connected to the output terminal of the difference amplifier, wherein the second transistor is configured to conduct a second current therethrough which is less than the first current and to supply the second current to a second terminal of the current compensator.

In some embodiments, the current compensator is configured to compare the reference current to the second current, and when the second current is greater than or equal to the reference current, then the output terminal of the current compensator draws substantially no current from the second terminal of the first transistor, and when the second current is less than the reference current, then the output terminal of the current compensator draws a non-zero compensation current from the second terminal of the first transistor which is proportional to a difference between the reference current and the second current.

In some versions of these embodiments: a size of the first transistor is a multiple N times a size of the second transistor; the first current is the multiple N of the second current; and the threshold current is the multiple N of the reference current, minus a quiescent current flowing through the feedback circuit, where N is greater than 1.

In some versions of these embodiments, N is greater than or equal to two.

In some versions of these embodiments, N is greater than or equal to ten.

In some embodiments, the feedback circuit comprises a resistor divider comprising at least two resistors connected in series between the second terminal of the first transistor and a second supply voltage, and wherein the second input terminal of the difference amplifier is connected to a node between the at least two resistors.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As used herein, "approximately" means within 10%. When two values are said to be "substantially the same" it means that the values are the same within the reasonable manufacturing tolerances. By contrast, "substantially different" means substantially not the same, and therefore "more different" than reasonable manufacturing tolerances.

Example amplifiers will be described below where the gain elements are field effect transistors (FETs), such as p-channel metal oxide semiconductor field effect transistors (PMOS transistors). However, it should be understood that the principles described below can be extended to other types of gain elements, such as hetero junction bipolar transistors (HBTs), GaN FETs, GaAs PHEMTs, etc.

Figure 1:
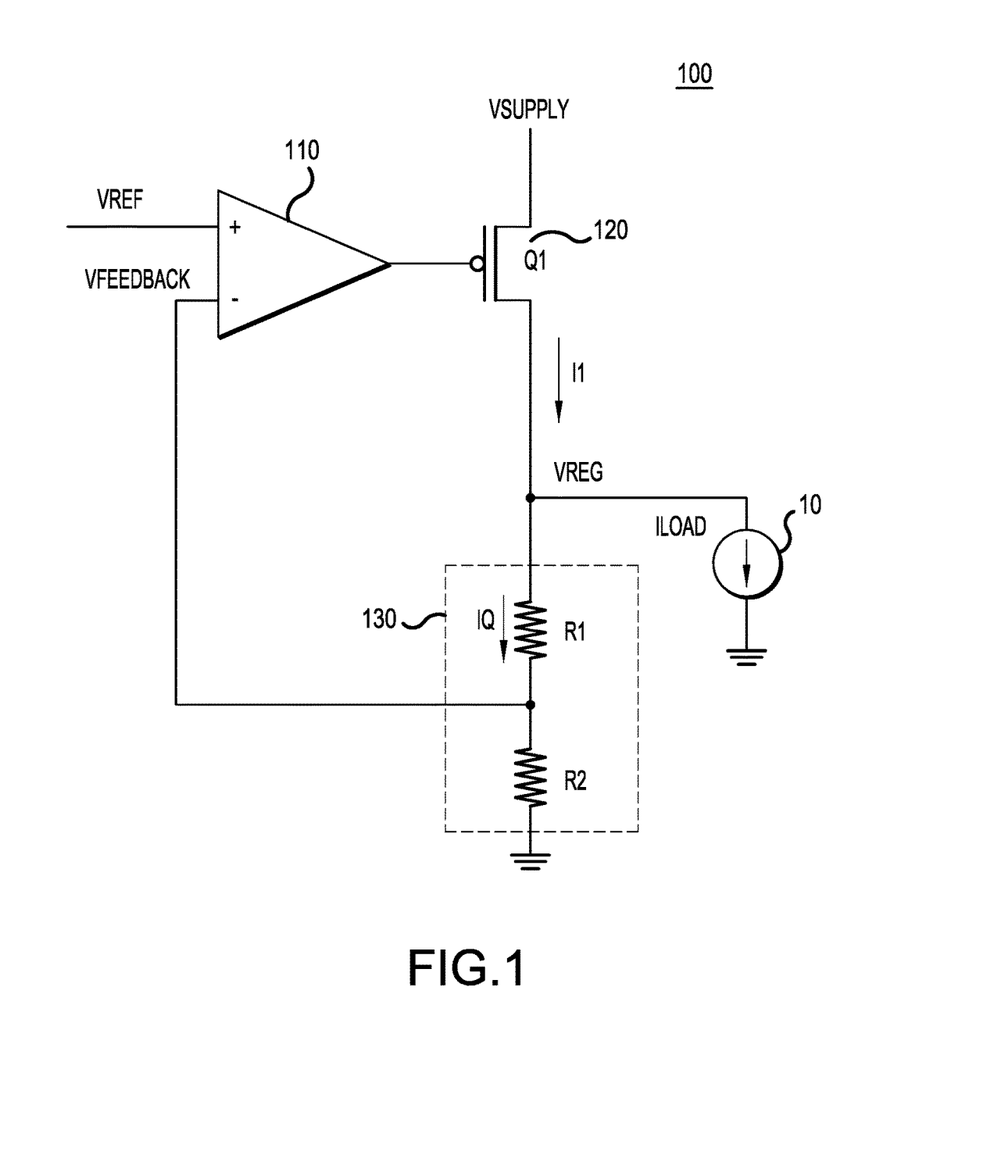
FIG. 1 is a schematic drawing of an example of a voltage regulator with feedback.

FIG. 1 is a schematic drawing of an example of a voltage regulator 100 with feedback. Voltage regulator 100 may be one example of a low drop out voltage regulator.

Voltage regulator 100 includes a difference amplifier 110, a transistor (Q1) 120, and a feedback circuit 130.

Difference amplifier 110, also sometimes referred to as a differential amplifier, has a first input terminal, a second input terminal, and an output terminal. Although not shown in FIG. 1, in general difference amplifier 110 has first and second supply voltage terminals. Here, the first supply voltage terminal may be connected to a supply voltage VSupply, and the second supply voltage terminal may be connected to a second supply voltage (e.g., ground). Also, in voltage regulator 100 the first input terminal of difference amplifier 110 is a non-inverting input and the second input terminal of difference amplifier 110 is an inverting terminal. The voltage at the output terminal of difference amplifier 110 reflects a difference between the voltage at the first input terminal (non-inverting input) and the voltage at the second input terminal (inverting terminal).

In voltage regulator 100, the first input terminal of difference amplifier 110 is connected to receive a reference voltage VRef, for example from a Zener diode.

Transistor 120 has a first terminal, a second terminal, and a control terminal. The first terminal is connected to the supply voltage VSupply and the control terminal is connected to the output terminal of difference amplifier 110. Transistor 120 is configured to pass a first current I1 therethrough, and to supply a regulated voltage VReg and load current ILoad to a load 10, and a quiescent current IQ to feedback circuit 130.

Feedback circuit 130 comprises a resistor divider including at least a first resistor R1 and a second resistor R2 connected in series between the second terminal of the first transistor and ground. A node between the first and second resistors R1 and R2 is connected to, and configured to supply a feedback voltage VFeedback to, the second input terminal of the difference amplifier 110.

In operation, difference amplifier 110 supplies an output voltage to the control terminal of transistor 120 to cause the current I1 through transistor 120 to vary as necessary to drive load 10 and to maintain the feedback voltage VFeedback to be equal to the reference voltage VRef. In particular, as noted above, a portion of current I1 flows through feedback circuit 130 as the quiescent current IQ=VReg/(R1+R2), and the feedback voltage VFeedback=IQ*R2.

In general, voltage regulator 100 may maintain a low dropout voltage. Also, Furthermore, R1 and R2 may be selected to have a very low quiescent current IQ for a given regulated voltage VReg, thus providing low power consumption by voltage regulator 100.

However, as noted above, if the phase margin of the feedback loop is too low, then voltage regulator 100 may begin to oscillate. This may occur, for example, if the quiescent current IQ of voltage regulator 100 is too small, particularly at low load currents ILoad. The quiescent current IQ of voltage regulator 100 may be increased to increase the phase margin, but that will increase the power consumed by voltage regulator 100 and decrease its efficiency, which as explained above is undesirable.

Figure 2:
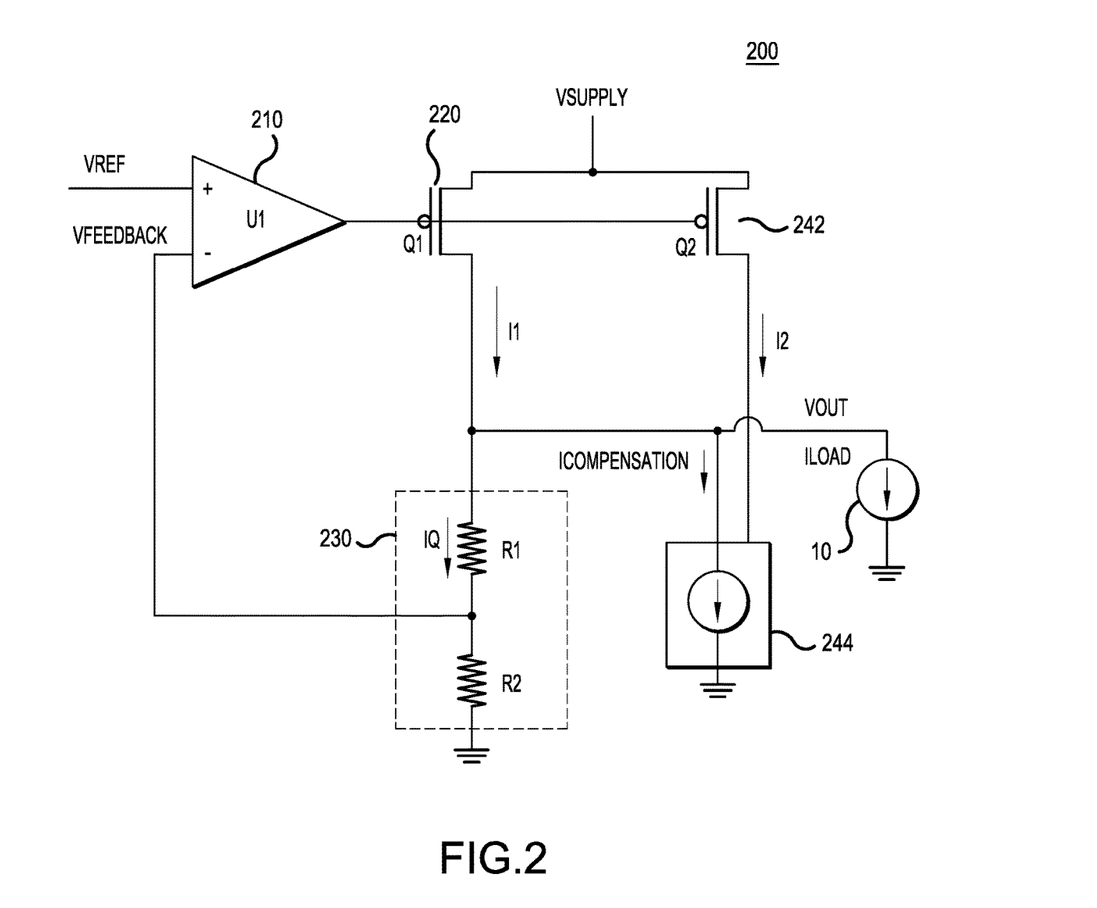
FIG. 2 is a schematic drawing of an example embodiment of a voltage regulator with feedback which includes a smart current compensator.

FIG. 2 is a schematic drawing of an example embodiment of a voltage regulator 200 with feedback which includes a smart current compensator.

Voltage regulator 200 includes a difference amplifier 210, a first transistor (Q1) 220, a feedback circuit 230, a second transistor (Q2) 242 and a current compensator 244.

Difference amplifier 210, also sometimes referred to as a differential amplifier, has a first input terminal, a second input terminal, and an output terminal. Although not shown in FIG. 2, in general difference amplifier 210 has first and second supply voltage terminals. Here, the first supply voltage terminal may be connected to a supply voltage VSupply, and the second supply voltage terminal may be connected to ground. Also, in voltage regulator 100 the first input terminal of difference amplifier 210 is a non-inverting input and the second input terminal of difference amplifier 210 is an inverting terminal. The voltage at the output terminal of difference amplifier 210 reflects a difference between the voltage at the first input terminal (non-inverting input) and the voltage at the second input terminal (inverting terminal).

In voltage regulator 200, the first input terminal of difference amplifier 210 is connected to receive a reference voltage VRef, for example from a Zener diode.

First transistor 220 has a first terminal, a second terminal, and a control terminal. The first terminal is connected to the supply voltage VSupply and the control terminal is connected to the output terminal of difference amplifier 210. First transistor 220 is configured to pass a first current I1 therethrough, and to supply a regulated voltage VReg and load current ILoad to a load 10, and a quiescent current IQ to feedback circuit 230. Here, transistor 220 may be a PMOS transistor.

Feedback circuit 230 includes a first resistor R1 and a second resistor R2 connected in series between the second terminal of the first transistor and ground. A node between the first and second resistors R1 and R2 is connected to, and configured to supply a feedback voltage VFeedback to, the second input terminal of the difference amplifier 210.

Second transistor 242 has a first terminal, a second terminal, and a control terminal. The first terminal is connected to the supply voltage VSupply and the control terminal is connected to the output terminal of difference amplifier 210. Second transistor 242 is configured to conduct a second current I2 therethrough. Here, transistor 220 may be a PMOS transistor.

Here, first transistor 220 has a first size S1, and second transistor 242 has a second size S2 which is less than the first size. That is, second transistor 242 is smaller than first transistor 220. In particular, first transistor 220 has a size S1=N*S2, or N times the size S2 of second transistor 242, where N>1. In some embodiments, the size of first transistor 220 is much greater than the size of second transistor 242. In some embodiments, N>2. In still other embodiments, N>10.

Because the first terminals of first transistor 220 and second transistor 242 are both connected in common to the supply voltage VSupply, and the control terminals of first transistor 220 and second transistor 242 are both connected in common to the output terminal of difference amplifier 210, the ratio of first current I1 flowing through first transistor 220 to the second current I2 flowing through second transistor 242 follows the ratio, N, of the size S1 of first transistor 220 to the size S2 of second transistor 242. In other words, the second current I2 is equal to the first current I1 divided by N, where in some embodiments N may be a number greater than or equal to two, and in some embodiments N may be a number greater than or equal to ten (10). So, if I1 decreases, for example because the current ILoad drawn by load 10 decreases, the current I2 will also decrease by a proportional amount. As will be described in greater detail below, advantage may be taken of this fact in order to intelligently improve the phase margin of voltage regulator 200.

FIG. 2 illustrates an example embodiment where the reference voltage VRef is supplied to the non-inverting first input terminal of difference amplifier 210, the feedback voltage VFeedback is supplied to the inverting first input terminal of difference amplifier 210, and first and second transistors 220 and 242 are PMOS transistors However, In other embodiments, the first input terminal of difference amplifier 210 may be the non-inverting terminal and the second input terminal of difference amplifier 210 may be the inverting terminal. In that case, first transistor 220 and second transistor 242 may be replaced with NMOS transistors and any other necessary modifications to the circuit may be made. Those skilled in the art will understand how to make such modifications to voltage regulator 200 to provide sundry variations on the basic circuit.

In operation, difference amplifier 210 supplies an output voltage to the control terminal of first transistor 220 to cause a first current I1 through first transistor 220 to vary as necessary to drive load 10 and to maintain the feedback voltage VFeedback to be equal to the reference voltage VRef. In particular, a portion of first current I1 flows through feedback circuit 230 as a quiescent current IQ=VReg/(R1+R2), and the feedback voltage VFeedback=IQ*R2.

In general, voltage regulator 200 may maintain a low dropout voltage.

Furthermore, R1 and R2 may be selected to have a very low quiescent current IQ for a given regulated voltage VReg, thus providing low power consumption by voltage regulator 100.

However, unlike voltage regulator 100, in voltage regulator 200, current compensator 244 may draw an additional compensation current at low load currents ILoad to provide an increased phase margin to prevent the feedback loop of voltage regulator 200 from oscillating. In particular, as will explained in more detail below with respect to FIG. 3, current compensator 244 may be a "smart" current compensator which draws an additional compensation current ICompensation from first transistor 220 when the load current ILoad supplied by first transistor 220 to load 10 is less than a desired threshold current $I_{TH}$. The additional compensation current ICompensation in turn increases the first current I1, thereby increasing the phase margin of voltage regulator 200. On the other hand, current compensator 244 draws substantially no compensation current ICompensation from first transistor 220 when the load current ILoad supplied by first transistor 220 to load 10 is greater than or equal to the threshold current $I_{TH}$. The threshold current $I_{TH}$ may be selected so that a desired minimum phase margin is maintained for voltage regulator 200.

Figure 3:
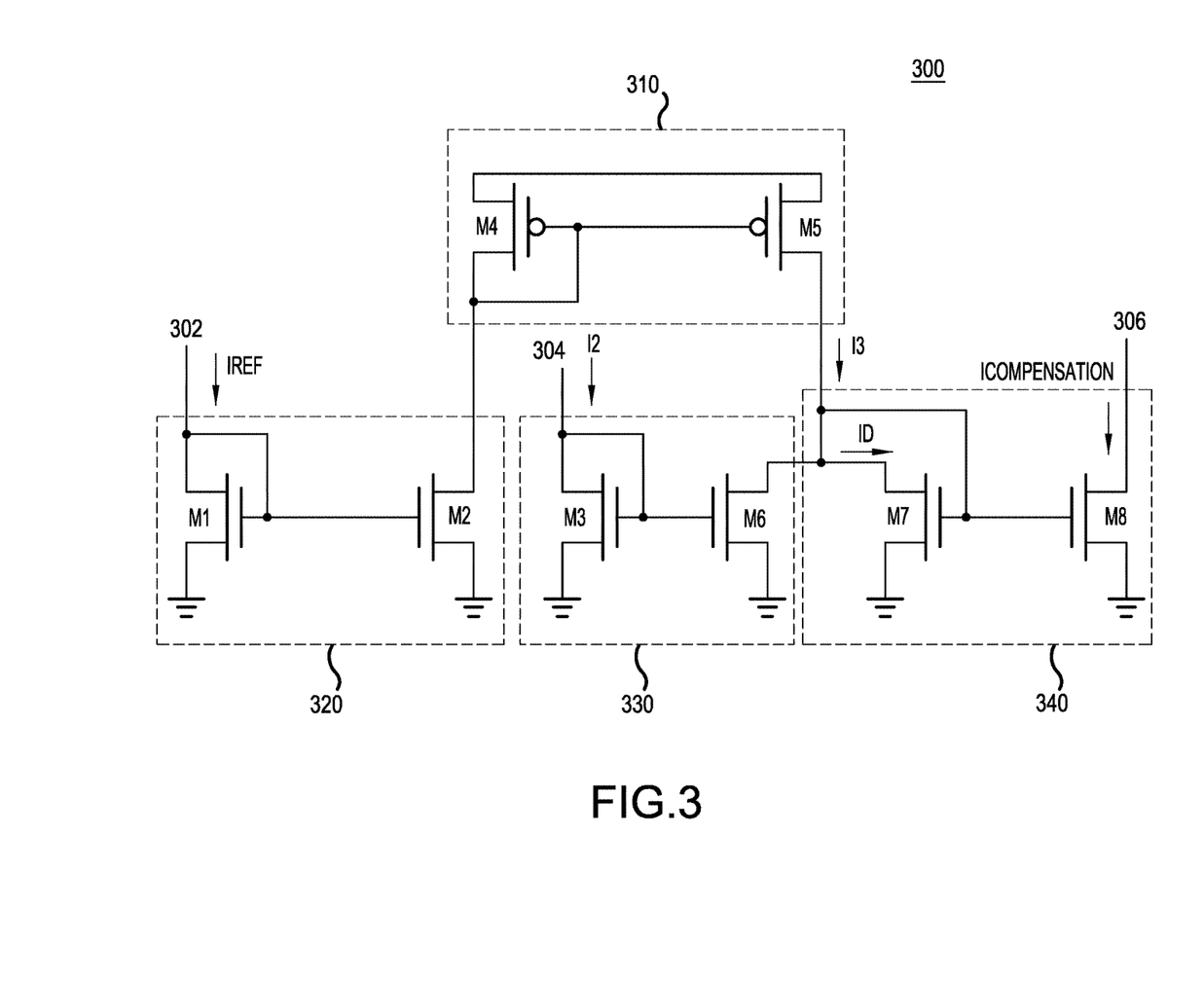
FIG. 3 is a schematic drawing of an example embodiment of a smart current compensator.

FIG. 3 is a schematic drawing of an example embodiment of a smart current compensator 300. Current compensator 300 may be one embodiment of current compensator 244 of voltage regulator 200. Current compensator 300 has a first terminal 302, a second terminal 304, and an output terminal 306. Current compensator 300 includes a plurality of transistors M1, M2, M3, M4, M5, M6, M7 and M8 organized into a plurality of current mirrors, including: a first current mirror 310 comprising transistors M4 and M5; a second current mirror 320 comprising transistors M1 and M2; a third current mirror 330 comprising transistors M3 and M6; and a fourth current mirror 340 comprising transistors M7 and M8. In some embodiments: M1 may be the same size as M2; M4 may be the same size as M5; M3 may be the same size as M6; and M7 may be the same size as M8.

In operation, transistor M1 of second current mirror 320 receives a reference current IRef via first terminal 302, and second current mirror 320 mirrors the reference current IRef to transistor M2 which receives its current from transistor M4 in a first branch of first current mirror 310. Meanwhile, transistor M3 of third current mirror 330 receives the second current I2 via second terminal 304 from second transistor 242, and third current mirror 330 mirrors the second current I2 to transistor M6, which receives its current from transistor M5 in a second branch of first current mirror 310. Accordingly, it may be said that second current mirror 320 mirrors the reference current IRef to a first branch of first current mirror 310, and third current mirror 330 mirrors the second current I2 to the second branch of first current mirror. Since transistor M6 conducts the second current I2 due to the action of third current mirror 330, transistor M7 of fourth current mirror 340 conducts a difference current ID which is the difference between the current IRef in the second branch of first current mirror 310 and the second current I2 flowing through transistor M6. Fourth current mirror 340 mirrors difference current ID to transistor M8 via output terminal 306 as a compensation current ICompensation.

So long as second current I2 is greater than or equal to the reference current IRef, then ID is substantially zero, and output terminal 306 of current compensator 300 draws substantially no current from the second terminal of first transistor 220 (see FIG. 2). As noted about, second current I2 tracks first current I1, so by selecting IRef to satisfy: IRef=($I_{TH}$/N+IQ/N), then current compensator 300 will draw substantially no extra current or consume extra power so long as the load current ILoad equals or exceeds the threshold current $I_{TH}$, and the efficiency of voltage regulator 200 may be maintained. However, when the second current I2 is less than the reference current IRef (indicating that the load current ILoad is less than the $I_{TH}$ threshold current $I_{TH}$), then output terminal 306 of current compensator 300 draws a non-zero compensation current ICompensation from the second terminal of first transistor 220 which is proportional to the difference current ID=IRef−I2. Thus current compensator 300 is configured to compare the reference current IRef to the second current I2, and when the second current I2 is greater than or equal to the reference current IRef, then output terminal 306 of current compensator 300 draws substantially no current from the second terminal of first transistor 220, and when the second current I2 is less than the reference current IRef, then output terminal 306 of current compensator 300 draws a non-zero compensation current ICompensation from the second terminal of first transistor 220 which is proportional to a difference between the reference current IRef and the second current I2. Accordingly, a desired phase margin may be maintained for voltage regulator 200 in cases where the load current ILoad is small.

Figure 4:
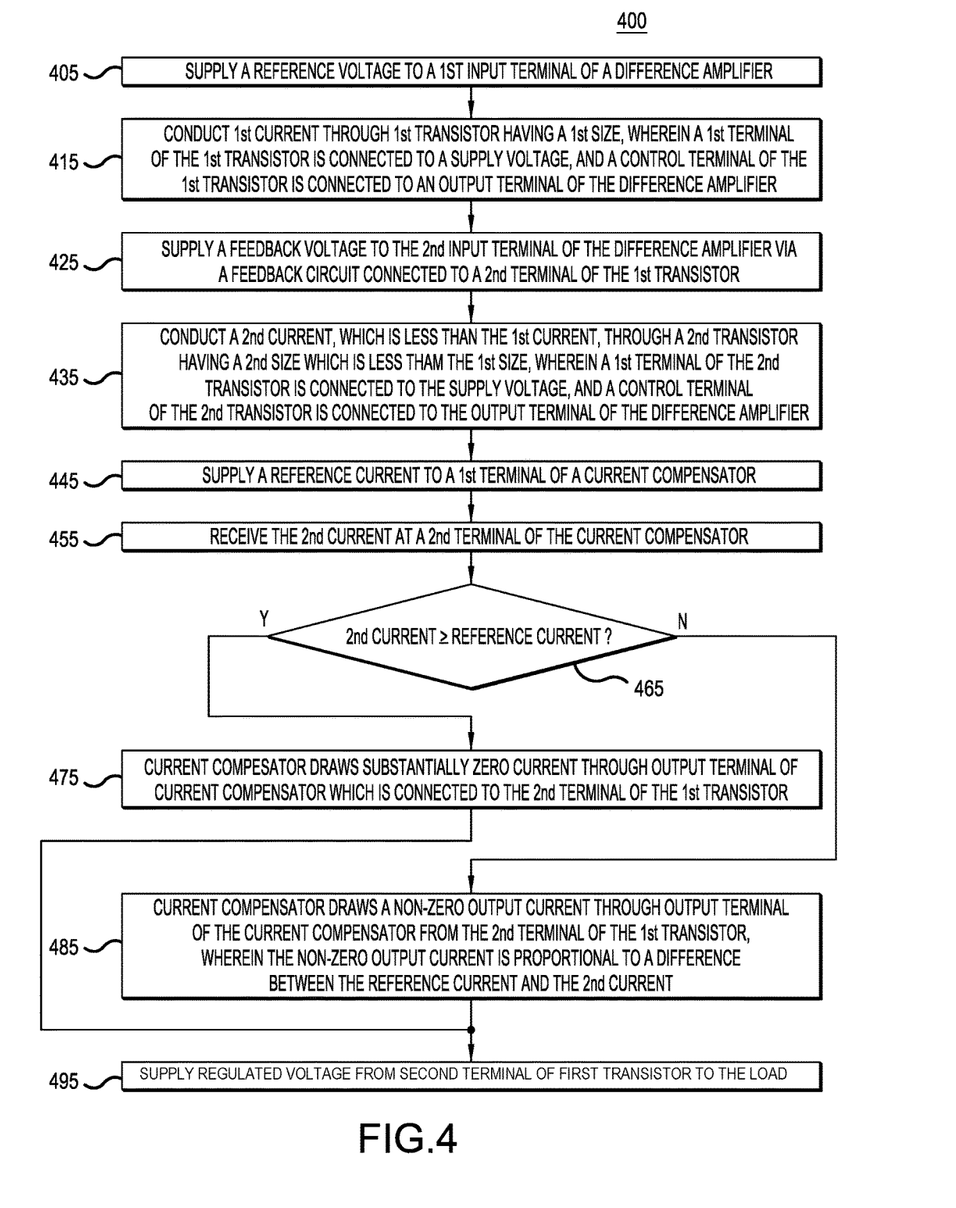
FIG. 4 is a flowchart of an example embodiment of a method of providing a regulated voltage to a load.

FIG. 4 is a flowchart of an example embodiment of a method 400 of providing a regulated voltage to a load which may be executed by a voltage regulator such as voltage regulator 200.

An operation 405 includes supplying a reference voltage to a first input terminal of a difference amplifier.

An operation 415 includes conducting a first current through a first transistor having a first size, wherein a first terminal of the first transistor is connected to a supply voltage, and a control terminal of the first transistor is connected to an output terminal of the difference amplifier.

An operation 425 includes supplying a feedback voltage to the second input terminal of the difference amplifier via a feedback circuit connected to a second terminal of the first transistor.

An operation 435 includes conducting a second current, which is less than the first current, through a second transistor having a second size which is less than the first size, wherein a first terminal of the second transistor is connected to the supply voltage, and a control terminal of the second transistor is connected to the output terminal of the difference amplifier.

An operation 445 includes supplying a reference current to a first terminal of a current compensator.

An operation 455 includes receiving the second current at a second terminal of the current compensator.

An operation 465 includes comparing the second current to the reference current.

In an operation 475, when the second current is greater than or equal to the reference current, the current compensator draws substantially zero current through an output terminal of the current compensator which is connected to the second terminal of the first transistor.

In an operation 485, when the second current is less than the reference current, the current compensator draw a non-zero compensation current through the output terminal of the current compensator from the second terminal of the first transistor, wherein the non-zero compensation current is proportional to a difference between the reference current and the second current.

An operation 495 includes supplying a regulated voltage from a second terminal of the first transistor to a load.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A voltage regulator, comprising:
a difference amplifier having a first input terminal, a second input terminal, and an output terminal, wherein the first input terminal is connected to receive a reference voltage;
a first transistor having a first size and further having a first terminal, a second terminal, and a control terminal, wherein the first terminal is connected to a supply voltage, the second terminal is configured to supply a regulated voltage to a load, and the control terminal is connected to the output terminal of the difference amplifier, wherein the first transistor is configured to conduct a first current therethrough;
a feedback circuit connected to the second terminal of the first transistor and configured to supply a feedback voltage to the second input terminal of the difference amplifier;
a second transistor having a second size which is less than the first size, and further having a first terminal, a second terminal, and a control terminal, wherein the first terminal is connected to the supply voltage, and the control terminal is connected to the output terminal of the difference amplifier, wherein the second transistor is configured to conduct a second current therethrough which is less than the first current; and
a current compensator having a first terminal, a second terminal, and an output terminal, wherein the first terminal is configured to receive a reference current, the second terminal is connected to the second terminal of the second transistor to receive the second current, and the output terminal connected to the second terminal of the first transistor,
wherein when the second current is greater than or equal to the reference current, then the output terminal of the current compensator draws substantially no current from the second terminal of the first transistor, and when the second current is less than the reference current, then the output terminal of the current compensator draws a non-zero compensation current from the second terminal of the first transistor which is proportional to a difference between the reference current and the second current.

2. The voltage regulator of claim 1, wherein the current compensator comprises a plurality of current mirrors, including:
a first current mirror,
a second current mirror for mirroring the reference current to a first branch of the first current mirror,
a third current mirror for mirroring the second current to a second branch of the first current mirror, and
a fourth current mirror for mirroring to the output terminal a difference current between a current in the second branch of the first current mirror and the second current.

3. The voltage regulator of claim 1, wherein the second current is equal to the first current divided by N, wherein N is a number greater than or equal to two.

4. The voltage regulator of claim 3, wherein N is a number greater than or equal to 10.

5. The voltage regulator of claim 1, wherein the feedback circuit comprises a resistor divider comprising at least two resistors connected in series between the second terminal of the first transistor and a second supply voltage, and wherein the second input terminal of the difference amplifier is connected to a node between the at least two resistors.

6. The voltage regulator of claim 1, wherein the regulated voltage is greater than the reference voltage.

7. The voltage regulator of claim 1, wherein the first input terminal of the difference amplifier is a non-inverting input, the second input terminal of the difference amplifier is an inverting input, and the first and second transistors are each P-channel field effect transistors.

8. A method, comprising:
supplying a reference voltage to a first input terminal of a difference amplifier;
conducting a first current through a first transistor having a first size, wherein a first terminal of the first transistor is connected to a supply voltage, and a control terminal of the first transistor is connected to an output terminal of the difference amplifier;
supplying a feedback voltage to a second input terminal of the difference amplifier via a feedback circuit connected to a second terminal of the first transistor;
conducting a second current, which is less than the first current, through a second transistor having a second size which is less than the first size, wherein a first terminal of the second transistor is connected to the supply voltage, and a control terminal of the second transistor is connected to the output terminal of the difference amplifier;
supplying a reference current to a first terminal of a current compensator;
receiving the second current at a second terminal of the current compensator;
when the second current is greater than or equal to the reference current, the current compensator drawing substantially zero current through an output terminal of the current compensator which is connected to the second terminal of the first transistor;
when the second current is less than the reference current, the current compensator drawing a non-zero compensation current through the output terminal of the current compensator from the second terminal of the first transistor, wherein the non-zero compensation current is proportional to a difference between the reference current and the second current; and
supplying a regulated voltage from a second terminal of the first transistor to a load.

9. The method of claim 8, further comprising:
mirroring the reference current to a first branch of a first current mirror;
mirroring the second current to a second branch of the first current mirror; and
mirroring to the output terminal of the current compensator a difference current between a current in the second branch of the first current mirror and the second current.

10. The method of claim 8, wherein the second current is equal to the first current divided by N, wherein N is a number greater than or equal to two.

11. The method of claim 10, wherein N is a number greater than or equal to 10.

12. The method of claim 8, wherein the regulated voltage is greater than the reference voltage.

13. A voltage regulator, comprising:
a difference amplifier having a first input terminal, a second input terminal, and an output terminal, wherein the first input terminal is connected to receive a reference voltage;
a first transistor having a first terminal, a second terminal, and a control terminal, wherein the first terminal is connected to a supply voltage, the second terminal is configured to supply a regulated voltage to a load, and the control terminal is connected to the output terminal of the difference amplifier, wherein the first transistor is configured to conduct a first current therethrough;
a feedback circuit connected to the second terminal of the first transistor and configured to supply a feedback voltage to the second input terminal of the difference amplifier; and
a current compensator configured to draw a compensation current from the first transistor when a load current supplied by the first transistor to the load is less than a threshold current, thereby increasing the first current, and configured to draw substantially no compensation current from the first transistor when the load current supplied by the first transistor to the load is greater than or equal to the threshold current.

14. The voltage regulator of claim 13, wherein the current compensator has a first terminal configured to receive a reference current.

15. The voltage regulator of claim 14, further comprising a second transistor which is smaller than the first transistor, wherein the second transistor has a first terminal, a second terminal, and a control terminal, wherein the first terminal is connected to the supply voltage, and the control terminal is connected to the output terminal of the difference amplifier, wherein the second transistor is configured to conduct a second current therethrough which is less than the first current and to supply the second current to a second terminal of the current compensator.

16. The voltage regulator of claim 15, wherein the current compensator is configured to compare the reference current to the second current, and when the second current is greater than or equal to the reference current, then the output terminal of the current compensator draws substantially no current from the second terminal of the first transistor, and when the second current is less than the reference current, then the output terminal of the current compensator draws a non-zero compensation current from the second terminal of the first transistor which is proportional to a difference between the reference current and the second current.

17. The voltage regulator of claim 16, wherein: a size of the first transistor is a multiple N times a size of the second transistor; the first current is the multiple N of the second current; and the threshold current is a multiple N of the reference current minus a quiescent current flowing through the feedback circuit, where N is greater than 1.

18. The voltage regulator of claim 17, wherein N is greater than or equal to two.

19. The voltage regulator of claim 17, wherein N is greater than or equal to ten.

20. The voltage regulator of claim 13, wherein the feedback circuit comprises a resistor divider comprising at least two resistors connected in series between the second terminal of the first transistor and a second supply voltage, and wherein the second input terminal of the difference amplifier is connected to a node between the at least two resistors.

* * * * *